United States Patent
Maekawa et al.

[11] Patent Number: 5,846,335
[45] Date of Patent: Dec. 8, 1998

[54] METHOD FOR CLEANING WORKPIECE

[75] Inventors: Toshiro Maekawa, Sagamihara; Koji Ono, Fujisawa; Motoaki Okada, Tokyo; Tamami Takahashi, Tanashi, all of Japan; Shiro Mishima, Wappingers Falls, N.Y.; Masako Kodera, Yokohama, Japan; Atsushi Shigeta, Fujisawa, Japan; Riichiro Aoki, Tokyo, Japan; Gisuke Kouno, Oita, Japan

[73] Assignees: Ebara Corporation, Tokyo; Kabushiki Kaisha Toshiba, Kawasaki, both of Japan

[21] Appl. No.: 844,903

[22] Filed: Apr. 22, 1997

Related U.S. Application Data

[63] Continuation of Ser. No. 434,754, May 4, 1995, abandoned.

[30] Foreign Application Priority Data

Jun. 28, 1994 [JP] Japan ..................................... 6-168767

[51] Int. Cl.⁶ ............................... B08B 1/02; B08B 3/04; B08B 7/04
[52] U.S. Cl. .................................... 134/6; 134/7; 134/32; 134/33; 134/902
[58] Field of Search .............................. 134/6, 7, 32, 33, 134/902

[56] References Cited

U.S. PATENT DOCUMENTS

| | | | |
|---|---|---|---|
| 3,504,457 | 4/1970 | Jacobsen et al. | 51/131 |
| 4,141,180 | 2/1979 | Gill, Jr. et al. | 51/5 R |
| 4,935,981 | 6/1990 | Ohtani et al. | 15/21 C |
| 5,279,704 | 1/1994 | Saito | 134/33 |
| 5,320,706 | 6/1994 | Blackwell | 134/33 |
| 5,324,690 | 6/1994 | Gelatos et al. | 437/236 |
| 5,529,638 | 6/1996 | Lutz | 134/6 |
| 5,551,986 | 9/1996 | Jain | 134/6 |

FOREIGN PATENT DOCUMENTS

| | | |
|---|---|---|
| 0 304 645 | 3/1989 | European Pat. Off. . |
| 0 412 537 | 2/1991 | European Pat. Off. . |
| 51-9764 | 3/1976 | Japan ........................................ 134/6 |
| 64-58475 | 3/1989 | Japan . |
| 6-17283 | 5/1994 | Japan . |
| 6267918 | 9/1994 | Japan . |
| 94/04599 | 3/1994 | WIPO . |

OTHER PUBLICATIONS

Patent Abstracts of Japan, vol. 13, No. 252 (M–836), Jun. 12, 1989

Patent Abstracts of Japan, vol. 18, No. 673 (E–1647), Dec. 19, 1994

Patent Abstracts of Japan, vol. 5, No. 117 (E–067), Jul. 28, 1981

Patent Abstracts of Japan, vol. 6, No. 126 (M–142), Jul. 10, 1982

*Primary Examiner*—Zeinab El-Arini
*Attorney, Agent, or Firm*—Wenderoth, Lind & Ponack, L.L.P.

[57] ABSTRACT

A semiconductor cleaning method includes scrubbing a semiconductor wafer using a cleaning member made primarily of polyurethane and having micropores in a surface contacting the semiconductor wafer. The micropores have an average diameter ranging from 10 to 200 $\mu$m. The cleaning member may be made of either polyurethane foam or non-woven fabric composed of fibers bound together by urethane resin. By this scrubbing step, particles that are strongly attached to the surface of a substrate such as the semiconductor wafer can easily be removed. During cleaning of the substrate, surface irregularities and crystalline protrusions on the surface of a substrate such as a semiconductor wafer can be scraped off to adjust the surface roughness of the semiconductor wafer to a desired degree for making the semiconductor wafer surface flat.

39 Claims, 6 Drawing Sheets

F I G. 4
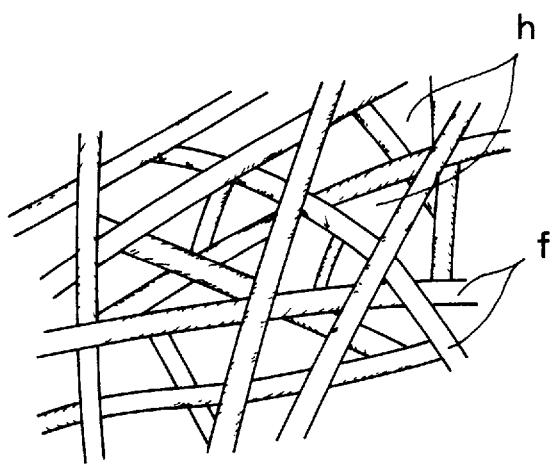

METHOD FOR CLEANING WORKPIECE

This application is a continuation of now abandoned application, Ser. No. 08/434,754, filed May 4, 1995.

BACKGROUND OF THE INVENTION

1. Field of the Invention

The present invention relates to a method of and an apparatus for cleaning a workpiece, and more particularly to a method of and an apparatus for cleaning a substrate that needs to have a high degree of cleanness, e.g., a semiconductor wafer, a glass substrate, a liquid crystal panel, or the like.

2. Description of the Prior Art

As semiconductor devices have become more highly integrated in recent years, circuit interconnections on semiconductor substrates have become finer and the distances between those circuit interconnections have become smaller. When semiconductor wafers are processed, small particles such as particles of semiconductor material, dust particles, crystalline protrusive particles, or the like often tend to be attached to the semiconductor wafers being processed. If a particle which is greater in size than the distance between interconnections exists on a semiconductor substrate, then the particle will short-circuit interconnections on the semiconductor substrate. Therefore, any undesirable particles on a semiconductor substrate have to be sufficiently smaller than the distance between interconnections on the semiconductor substrate. Such a problem and a requirement hold true for the processing of other substrates including a glass substrate to be used as a mask, a liquid crystal panel, and so on. To meet the above requirement, there have been practiced some cleaning procedures for removing fine particles or submicron particles off semiconductor wafers.

For example, it has heretofore been one practice to use a brush or a sponge to scrub a semiconductor wafer. A scrubbing process using a brush of nylon, mohair, or the like is effective to remove particles having diameters of 1 $\mu$m or larger off semiconductor wafers. However, such a scrubbing process fails to produce an appreciable cleaning effect on submicron particles smaller than those particle sizes.

Particles having diameters of 0.2 $\mu$m or larger can be removed from semiconductor wafers by another scrubbing process using a sponge of polyvinyl alcohol (PVA). This scrubbing process is, however, ineffective where particles are bonded to a semiconductor wafer with high bonding strength. Another problem is that the sponge of PVA cannot be self-cleaned as particles are entrapped by the sponge.

Some semiconductor fabrication processes include a polishing step known as a "water polishing step". The polishing step is employed to flatten surface irregularities on the surface of a semiconductor substrate which are produced when various layers are deposited thereon.

The polishing step is carried out by a polishing apparatus which comprises a turntable and a top ring for holding a semiconductor wafer to be polished. The surface of a semiconductor wafer to be polished is pressed against an abrasive cloth on the turntable by the top ring, and the turntable and the top ring are rotated to move the semiconductor wafer and the abrasive cloth relative to each other. At the same time, an abrasive solution is supplied to the abrasive cloth to polish the surface of the semiconductor wafer to a flat mirror finish.

In the water polishing step, the above polishing step is followed by subsequently supplying water, instead of the abrasive solution, to the abrasive cloth to finish the polished surface of the semiconductor wafer for a desired level of surface roughness. The water polishing step offers an additional advantage in that the abrasive solution attached to the semiconductor wafer at the time it is polished can be washed away from the semiconductor wafer.

However, since the water polishing step is carried out after the semiconductor wafer has been polished, remains of the used abrasive solution, ground-off particles of the semiconductor wafer, and worn-off pieces of the abrasive cloth exist on the abrasive cloth and tend to be attached to the semiconductor wafer during the water polishing step. With the water polishing step alone, however, it is difficult to lower an attached amount of particles to a strict level required by the recent semiconductor fabrication process.

The water polishing step suffers another drawback in that, since the water polishing step is limited to the polishing step, it cannot generally be used for other purposes, e.g., cannot be applied to other steps of a semiconductor fabrication process.

SUMMARY OF THE INVENTION

It is therefore an object of the present invention to provide a method of and an apparatus for effectively removing fine particles or submicron particles from a substrate, removing particles strongly attached to a substrate surface and microscratches on the substrate surface by scraping a thin layer off the substrate surface, holding particles when the substrate is cleaned, and self-cleaning a cleaning device after the substrate is cleaned.

According to the present invention, there is provided a method of cleaning a workpiece, comprising the step of scrubbing a workpiece with a cleaning member made primarily of polyurethane and having micropores in a surface contacting the workpiece, the micropores having an average diameter ranging from 10 to 200 $\mu$m.

According to the present invention, there is also provided a method of cleaning a workpiece, comprising the step of scrubbing a workpiece with a cleaning member made of a synthetic resin and having micropores in a surface contacting the workpiece, the synthetic resin having a Shore D hardness ranging from 30 to 80.

According to the present invention, there is further provided a method of cleaning a substrate, comprising the step of scrubbing a substrate with a cleaning member made of one of polyurethane foam and non-woven fabric composed of fibers bound together by urethane resin.

During the scrubbing step, a cleaning solution containing a surfactant may be supplied to the workpiece in one aspect. Ammonia and hydrogen peroxide, hydrogen chloride and hydrogen peroxide may be supplied to the workpiece in another aspect. A suspension composed of particles of colloidal silica suspended in an alkaline liquid may be supplied to the workpiece in still another aspect.

According to the present invention, there is also provided an apparatus for cleaning a substrate, comprising a spinning chuck for holding and rotating a substrate, a supporting member positioned above the spinning chuck, and a cleaning member rotatably mounted on the supporting member for contacting and cleaning the substrate held by the spinning chuck, the cleaning member being made primarily of polyurethane and having micropores in a surface contacting the substrate, the micropores having an average diameter ranging from 10 to 200 $\mu$m.

According to the present invention, there is also provided an apparatus for cleaning a substrate, comprising a spinning chuck for holding and rotating a substrate, a supporting member positioned above the spinning chuck, and a cleaning member rotatably mounted on the supporting member for contacting and cleaning the substrate held by the spinning chuck, the cleaning member being made of one of polyurethane foam and non-woven fabric composed of fibers bound together by urethane resin.

With the arrangement of the present invention, it is possible to remove minute particles or submicron particles from a substrate such as a semiconductor wafer for thereby cleaning the semiconductor wafer highly effectively.

Particles that are strongly attached to the surface of a substrate such as a semiconductor wafer can easily be removed by scrubbing.

At the same time a substrate is cleaned, surface irregularities and crystalline protrusions on the surface of a substrate such as a semiconductor wafer can be scraped off to adjust the surface roughness of the semiconductor wafer to a desired degree for making the semiconductor wafer surface flat.

The cleaning member that is used to clean a substrate such as a semiconductor wafer can easily be self-cleaned after it has cleaned the semiconductor wafer.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 4 is an enlarged fragmentary perspective view showing a surface of a cleaning member;

DETAILED DESCRIPTION OF THE PREFERRED EMBODIMENTS

Figure 1:
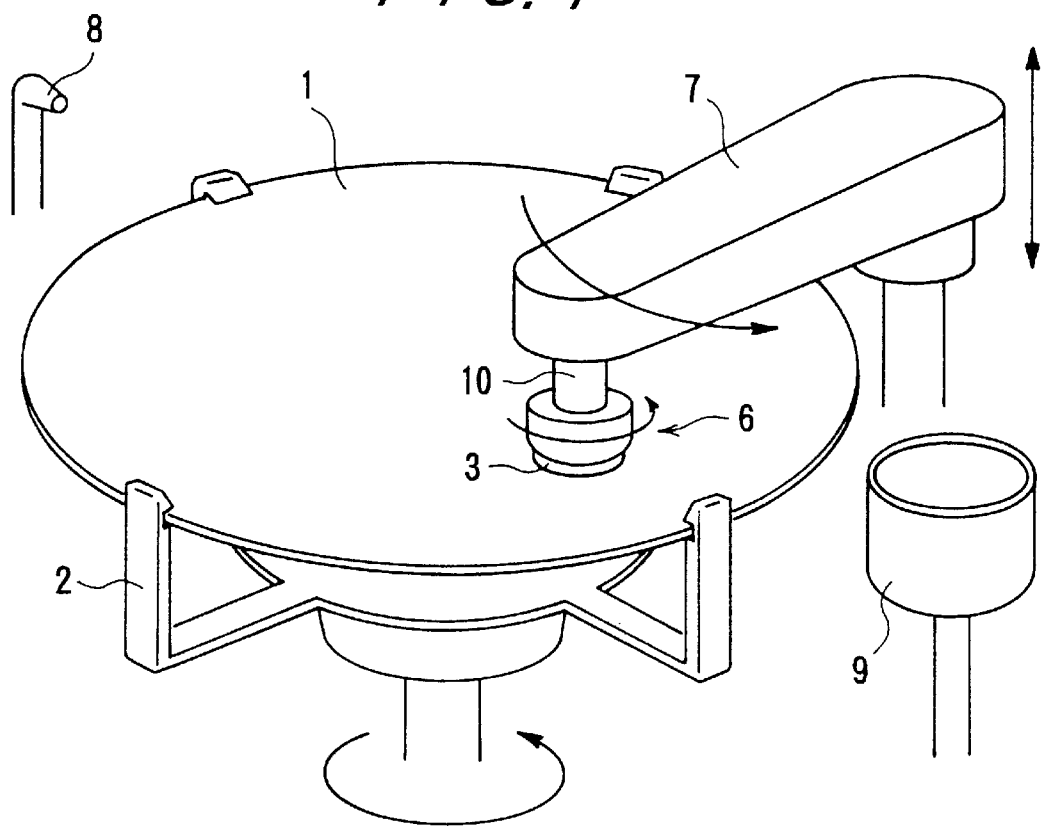
FIG. 1 is a fragmentary perspective view of a cleaning apparatus for carrying out a cleaning method according to the present invention.

As shown in FIG. 1, a cleaning apparatus for carrying out a cleaning method according to the present invention comprises a spinning chuck 2 for holding a semiconductor wafer 1 and rotating the semiconductor wafer 1 in a horizontal plane at a predetermined speed, and a rotatable cleaning device 6 incorporating a cleaning member 3 made of polyurethane foam and having minute holes defined in a surface thereof. The cleaning apparatus further comprises a vertically movable swing arm 7 supporting on its free end the cleaning device 6 for moving the cleaning device 6 over the semiconductor wafer 1 supported by the spinning chuck 2, a cleaning solution nozzle 8 for ejecting a cleaning solution onto a surface, to be cleaned, of the semiconductor wafer 1, and a cleaning cup 9 for cleaning the cleaning device 6. The swing arm 7 constitutes a supporting member for supporting the cleaning member 3. The cleaning device 6 is supported by a vertical rotatable shaft 10 on the free end of the swing arm 7, and can be rotated by the vertical rotatable shaft 10 at a predetermined speed.

The semiconductor wafer 1 is loaded into the cleaning apparatus after relatively large particles have been removed by a rinsing process or a scrubbing process using a brush. The semiconductor wafer 1 is clamped by the spinning chuck 2 with the surface to be cleaned of the semiconductor wafer 1 facing upwardly. At the same time the clamped semiconductor wafer 1 is rotated at a predetermined speed by the spinning chuck 2, a cleaning solution is ejected from the cleaning solution nozzle 8 toward the center of the semiconductor wafer 1.

The swing arm 7 is first in an initial position in which the cleaning device 6 supported thereon is placed in the cleaning cup 9. The cleaning device 6 is self-cleaned by soaking in a cleaning solution filled in the cleaning cup 9 when the cleaning device 6 is rotated in the cleaning cup 9. After the cleaning device 6 is self-cleaned, the rotation of the cleaning device 6 is stopped, and the swing arm 7 is lifted to take the cleaning device 6 out of the cleaning cup 9. Then, the swing arm 7 is turned to move the cleaning device 6 to a position above the center of the semiconductor wafer 1. Thereafter, the arm 7 is lowered to press a cleaning member 3 applied to the cleaning device 6 against the upper surface of the semiconductor wafer 1. The cleaning device 6 starts to rotate at a predetermined speed immediately before it contacts the semiconductor wafer 1.

The cleaning member 3 of the cleaning device 6 as it is rotated about the shaft 10 independently of the semiconductor wafer 1 is pressed by the swing arm 7 against the upper surface of the semiconductor wafer 1 while it is supported on and rotated by the spinning chuck 2. Then, the arm 7 is turned to angularly move the cleaning member 3 of the cleaning device 6 from the center of the semiconductor wafer 1 toward an outer circumferential edge of the semiconductor wafer 1 at a certain speed, thereby scrubbing the upper surface of the semiconductor wafer 1. When the cleaning member 3 has reached the outer circumferential edge of the semiconductor wafer 1, the swing arm 7 is stopped and then lifted to elevate the cleaning member 3 out of contact with the upper surface of the semiconductor wafer 1, thus completing one cycle of scrubbing operation. The scrubbing operation is repeated by moving the swing arm 7 again radially toward the center of the semiconductor wafer 1.

After at least one cycle of scrubbing operation has been carried out, the cleaning solution nozzle 8 stops ejecting the cleaning solution. The swing arm 7 is moved to bring the cleaning device 6 to a position above the cleaning cup 9. Then, the swing arm 7 is lowered to place the cleaning device 6 into the cleaning cup 9. The cleaning device 6 is rotated in the cleaning cup 9 and self-cleaned by the cleaning solution filled in the cleaning cup 9.

The scrubbing operation is followed immediately by rotating the spinning chuck 2 at a high speed in a dry, inert gas atmosphere for thereby spin-drying the scrubbed semiconductor wafer 1.

The swing arm 7 is angularly moved from the center of the semiconductor device 1 radially outwardly toward the outer circumferential edge thereof because the cleaning member 3 displaces contaminants and particles on the upper surface of the semiconductor wafer 1 radially outwardly in the same direction as centrifugal forces to which those contaminants and particles are subjected while the semiconductor wafer 1 is being rotated by the spinning chuck 2.

Figure 2:
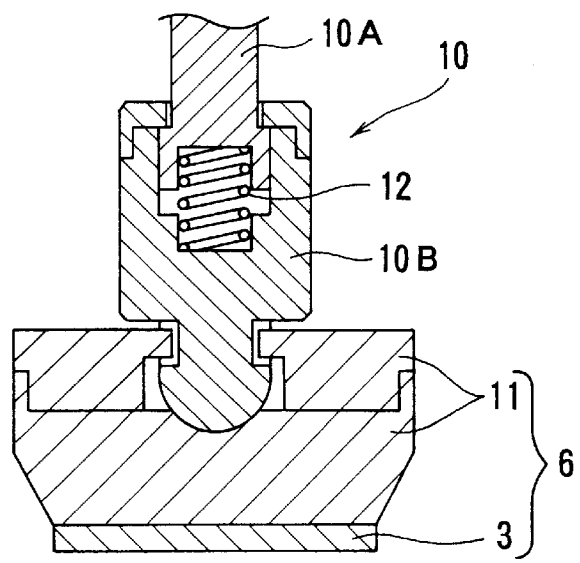
FIG. 2 is an enlarged fragmentary cross-sectional view of a cleaning device of the cleaning apparatus.

As shown in FIG. 2, the cleaning device 6 is mounted on the lower end of the shaft 10. The cleaning device 6 comprises a cartridge 11 having a lower surface to which the cleaning member 3 is applied. The cleaning member 3 comprises a polishing abrasive cloth that is cut to a suitable size. The polishing abrasive cloth has an adhesive seal on its reverse side which is bonded to the lower surface of the cartridge 11. The cartridge 11 has a partly spherical concave surface slidably held in contact with a partly spherical convex surface of the shaft 10. Therefore, the polishing abrasive cloth is maintained in uniform contact with the semiconductor wafer 1 even if the semiconductor wafer 1 clamped by the spinning chuck 2 is tilted or inclined.

The shaft 10 comprises an upper shaft member 10A and a lower shaft member 10B which are connected coaxially to each other with a compression coil spring 12 interposed therebetween. The compression coil spring 12 normally urges the lower shaft member 10B to move away from the upper shaft member 10A for dampening forces to be applied through the shaft 10 and the cleaning device 6 to the semiconductor wafer 1 while the cleaning device 6 is being held against the semiconductor wafer 1. Consequently, the cleaning member 3 can be kept in contact with the upper surface of the semiconductor wafer 1 under uniform pressure while the semiconductor wafer 1 is being scrubbed. Furthermore, the semiconductor wafer 1 is prevented from being damaged by undue forces which would be applied from the cleaning device 6 to the semiconductor wafer 1 when the semiconductor wafer 1 is tilted.

The polishing abrasive cloth of the cleaning member 3 is a commercially available polishing abrasive cloth that is generally used to polish semiconductor wafers to a flat mirror finish. Examples of the polishing abrasive cloth are Suba 800 and IC-1000 manufactured by Rodel Products Corporation and Surfin xxx-5 and Surfin 000 manufactured by Fujimi Inc. The polishing abrasive cloth sold under the tradenames Suba 800, Surfin xxx-5, and Surfin 000 is made of non-woven fabric composed of fibers bound together by urethane resin, and the polishing abrasive cloth sold under the tradename IC-1000 is made of polyurethane foam which is porous and has minute recesses or micropores in its surface.

The polishing abrasive cloth is used to polish semiconductor wafers, and has a structure which tends to attract abrasive grain contained in the cleaning solution. Therefore, when the polishing abrasive cloth is used to clean a semiconductor wafer, it is possible for the polishing abrasive cloth to remove easily those particles which are strongly attached to the surface of the semiconductor wafer.

The mechanism of a cleaning method for removing particles from the semiconductor wafer 1 with the cleaning member 3 composed of the polishing abrasive cloth will be described below with reference to FIG. 3.

Figure 3:
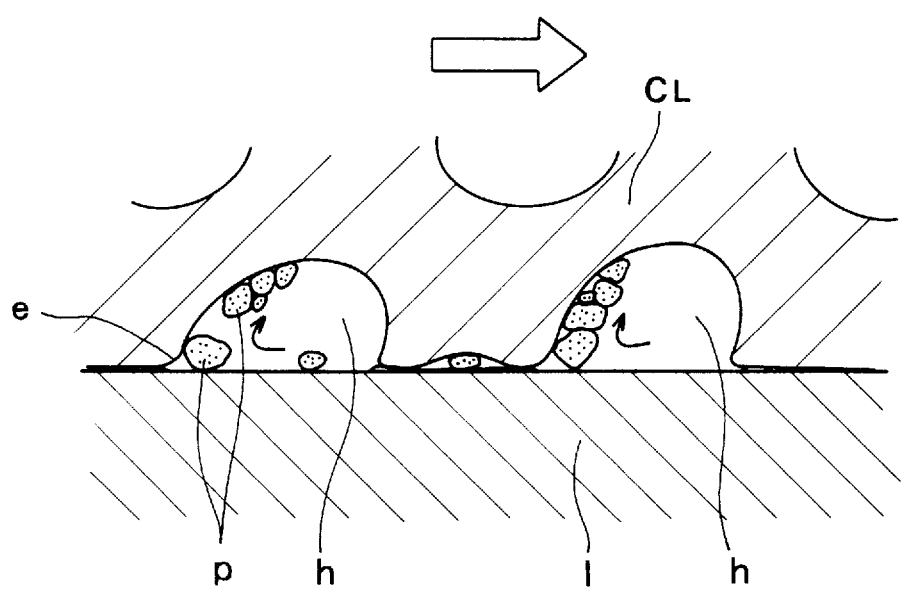
FIG. 3 is an enlarged fragmentary cross-sectional view illustrative of the mechanism of the cleaning method according to the present invention.

FIG. 3 shows in enlarged cross section the cleaning member 3 for cleaning the semiconductor wafer 1. In FIG. 3, the polishing abrasive cloth $C_L$ of the cleaning member 3 is made of polyurethane foam and hence has micropores "h" in its abrasive surface which is to be held in contact with the semiconductor wafer 1. The micropores "h" have a size which may be selected from a range of various sizes depending on the polishing abrasive cloth used, but preferably have an average size ranging from 10 to 200 $\mu$m for cleaning the semiconductor wafer 1. When the semiconductor wafer 1 and the polishing abrasive cloth $C_L$ are pressed against each other and moved relative to each other, particles "p" on the semiconductor wafer 1 are scraped off by edges "e" of the micropores "h", trapped into the micropores "h", and removed away from the semiconductor wafer 1.

The particles "p" are shown in an exaggerated state in FIG. 3, and are actually much smaller than the micropores "h". Since the polyurethane is harder than the PVA sponge, it is considered to be able to effectively scrape particles off the semiconductor wafer 1. The polishing abrasive cloth has a Shore D hardness ranging from 30 to 80. This level of hardness allows the polishing abrasive cloth to effectively scrape particles off the semiconductor wafer 1 without damaging the semiconductor wafer 1. If a cleaning member of greater hardness were used on the semiconductor wafer 1, it would damage the semiconductor wafer 1.

If the polishing abrasive cloth is pressed against the semiconductor wafer 1 under increased pressure, the polishing abrasive cloth itself exhibits an abrasive action to scrape off the particles and also a thin surface layer of the semiconductor wafer 1 to which the particles are attached. This is confirmed by the fact that the surface roughness of the semiconductor wafer 1 is smaller and hence its surface is smoother after it has been scrubbed by the polishing abrasive cloth than before it is scrubbed by the polishing abrasive cloth.

The micropores in the surface of the polishing abrasive cloth are closed, i.e., adjacent ones of those micropores are not joined to each other. Accordingly, those particles which are removed from the semiconductor wafer 1 and trapped in the micropores do not enter into the interior of the cleaning member 3. Therefore, the particles trapped in the micropores can easily be removed, keeping the cleaning member 3 clean.

After having scrubbed the semiconductor wafer 1, the cleaning member 3 is typically self-cleaned by being rotated in the cleaning solution filled in the cleaning cup 9, as described above. However, the cleaning member 3 may be cleaned by applying a water jet to the surface of the cleaning member 3 or ultrasonically vibrating the cleaning member 3.

While the cleaning member 3 has been described as being made of polyurethane foam, the cleaning member 3 may be made of non-woven fabric composed of fibers bound together by urethane resin. FIG. 4 shows at enlarged scale the surface of a piece of non-woven fabric composed of fibers bound together by urethane resin. As shown in FIG. 4, fibers "f" are intertwined and bound or united together by urethane resin. The non-woven fabric has micropores "h" provided by interstices between the fibers "f". The micropores "h" serve to trap particles off the semiconductor wafer 1 and remove them away from the semiconductor wafer 1 in the same manner as the cleaning member 3 made of polyurethane foam.

Figure 5:
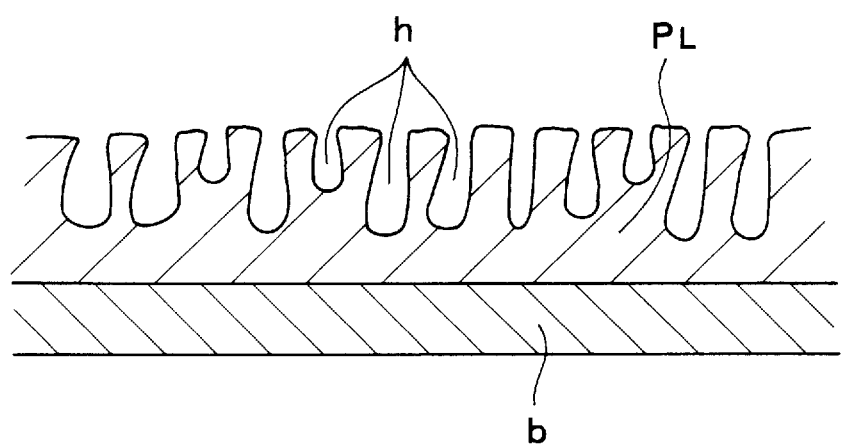
FIG. 5 is an enlarged fragmentary cross-sectional view of another cleaning member.

FIG. 5 shows in enlarged cross section another cleaning member which is made principally of polyurethane foam and has micropores in its surface, the surface being of a configuration which is different from that of the cleaning member shown in FIG. 3. The cleaning member shown in FIG. 5 comprises a base "b" of non-woven fabric composed of fibers bound together by urethane resin, and a layer $P_L$ of polyurethane foam disposed on an upper surface of the base "b". The layer $P_L$ of polyurethane foam has micropores "h", and includes a multiplicity of fibers extending upwardly which are produced upon foaming of the polyurethane. The cleaning member shown in FIG. 5 is used as a polishing abrasive cloth which is called a suede-type polishing abrasive cloth. The suede-type polishing abrasive cloth is particularly used for polishing semiconductor wafers of silicon (Si), gallium arsenide (GaAs), or the like.

The suede-type polishing abrasive cloth is slightly softer than the aforesaid polishing abrasive cloth of polyurethane foam or non-woven fabric composed of fibers bound together by urethane resin. However, the suede-type polishing abrasive cloth is also capable of scraping a thin surface layer off a substrate being cleaned. Since the suede-type polishing abrasive cloth is used to finish a semiconductor wafer in the polishing step, it is suitable for removing microscratches on the surface of the semiconductor wafer.

The cleaning solution used in the cleaning method of cleaning the semiconductor wafer with the cleaning member which is made primarily of polyurethane will be described below. By suitably selecting the cleaning solution to be used in combination with the cleaning member which is made primarily of polyurethane having micropores, it is possible to clean the semiconductor wafer with a composite cleaning effect that includes a mechanical cleaning effect based on scrubbing and a chemical cleaning effect using the cleaning solution.

First, a cleaning solution comprising a surface-active agent will be described below. A surfactant applied to a semiconductor wafer can weaken the force with which particles are attached to the surface of the semiconductor wafer, thus allowing the particles to be removed easily from the surface of the semiconductor wafer.

According to one mechanism in which particles are attached to the surface of a semiconductor wafer, they are attached, together with a fatty substance, i.e., an organic contaminant, to the surface of the semiconductor wafer. In this case, molecules of a surfactant applied as a cleaning solution to the semiconductor wafer enter between the surface thereof and the organic contaminant, engulf the organic contaminant, and dissolve it as oil droplets into the cleaning solution. Since the organic contaminant that increases the force with which the particles are attached to the surface of the semiconductor wafer is chemically removed by the surfactant, the force with which the particles are attached to the surface of the semiconductor wafer is reduced, and hence the particles can easily be removed from the surface of the semiconductor wafer.

If the surfactant is used as the cleaning solution, then because molecules of the surfactant remain attached to the surface of the semiconductor wafer, it is necessary to clean the surface of the semiconductor wafer with an acid to remove the molecules of the surfactant. Use of the surfactant as the cleaning solution in self-cleaning the cleaning member after it has scrubbed the semiconductor wafer is also effective in reducing the force with which particles are attached to the cleaning member.

Second, a cleaning solution comprising a mixture of ammonia ($NH_4OH$), hydrogen peroxide ($H_2O_2$), and pure water ($H_2O$) will be described below.

The cleaning solution is capable of etching away a thin layer off the surface of a substrate being cleaned, and is effective to remove organic contaminants, metal ions, and so on.

The ammonia, hydrogen peroxide, and pure water should preferably be mixed at a ratio of 1:1:5. The cleaning solution has an increased cleaning capability when heated.

Third, a cleaning solution comprising a mixture of hydrogen chloride (HCl), hydrogen peroxide ($H_2O_2$), and pure water ($H_2O$) will be described below.

The cleaning solution is effective to dissolve and remove metal ions or the like from the surface of a substrate being cleaned. When the substrate is contaminated by metal ions, ions of metals including sodium (Na), potassium (K), nickel (Ni), and iron (Fe) exist on the surface of the substrate. Since these contaminative metal ions affect electric properties of the substrate, particularly a semiconductor wafer, they should preferably be removed completely.

The hydrogen chloride, hydrogen peroxide, and pure water should preferably be mixed at a ratio of 1:1:5. The cleaning solution has an increased cleaning capability when heated.

Fourth, a cleaning solution comprising a suspension composed of particles of colloidal silica ($SiO_2$) suspended in an alkaline liquid such as of potassium hydroxide (KOH) or sodium hydroxide (NaOH) will be described below.

The cleaning solution is generally used as a polishing abrasive solution. The colloidal silica is in the form of a particulate solid and has a particle diameter of about 0.06 $\mu$m. If the cleaning solution is to be supplied during a cleaning process, the particles of colloidal silica should preferably have a uniform diameter.

Supplying the colloidal silica while a semiconductor wafer is being cleaned appears to further contaminate the semiconductor wafer. Actually, however, the colloidal silica has a mechanical cleaning effect to remove the particles attached to the semiconductor wafer by collision with the particles of colloidal silica. Since the alkaline liquid is also supplied, an organic contaminant can simultaneously be removed from the semiconductor wafer.

Inasmuch as the cleaning member can easily be self-cleaned, most of the colloidal silica attached to the cleaning member can be removed in a short period of time when the cleaning member is self-cleaned. Therefore, the cleaning member is repeatedly available for cleaning semiconductor wafers using the above cleaning solution.

The above four types of cleaning solutions can be used independently or in combination to clean substrates.

The cleaning member which is made principally of polyurethane is resistant to erosion upon exposure to acids or alkalis. Consequently, the cleaning solution may comprise an acid or an alkali. Since the cleaning member can easily be self-cleaned, fine particles may be used as a cleaning assistant.

Figure 6:
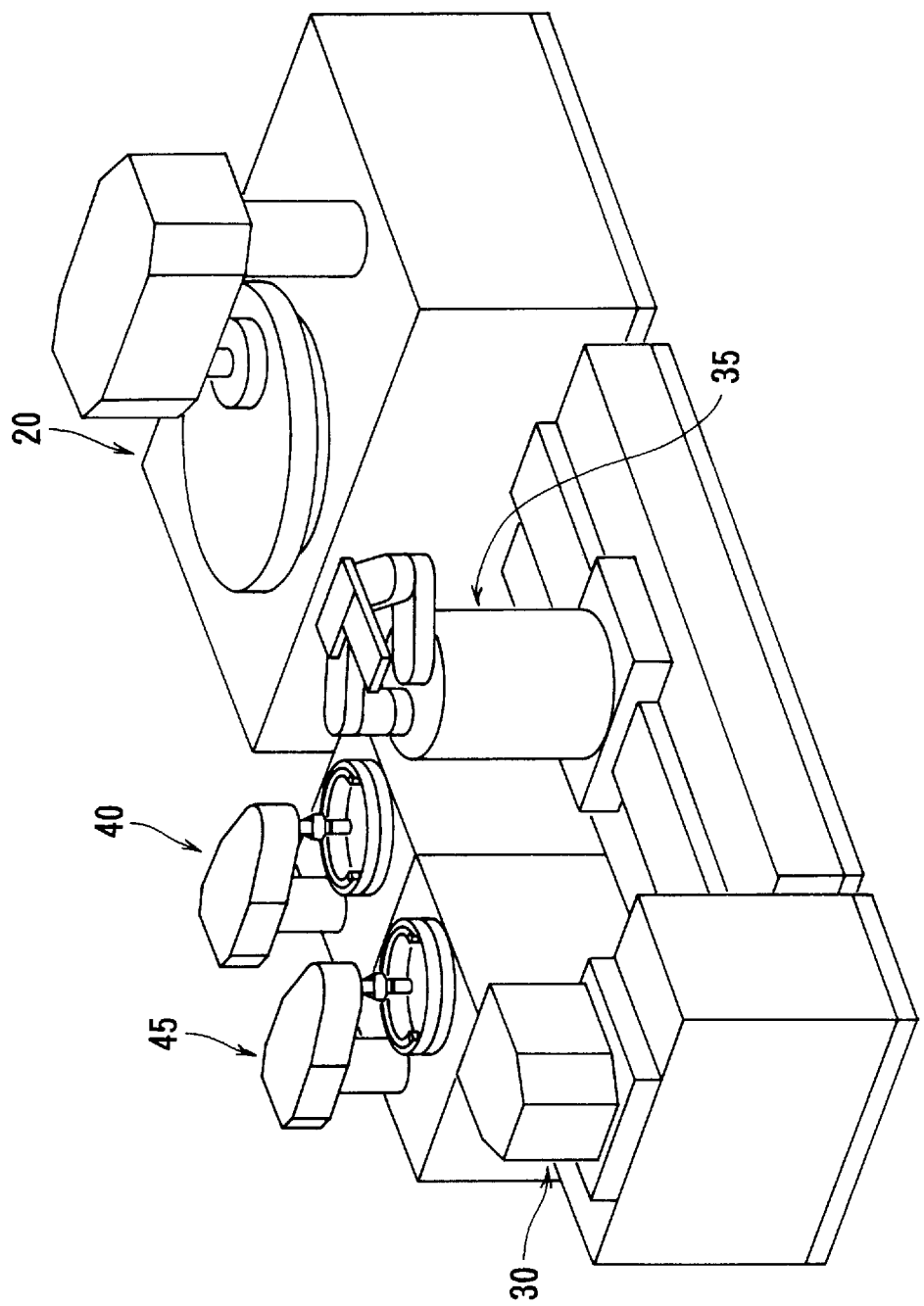
FIG. 6 is a perspective view of a system composed of cleaning apparatus according to the present invention which are combined with a polishing apparatus for polishing semiconductor wafers.

FIG. 6 shows a system composed of cleaning apparatus according to the present invention which are combined with a polishing apparatus for polishing semiconductor wafers. As shown in FIG. 6, the system comprises a polishing apparatus 20, a wafer storage cassette 30, a feed robot 35, a first cleaning apparatus 40, and a second cleaning apparatus 45.

A polishing step which is carried out by the polishing apparatus 20 is one of the steps of a semiconductor fabrication process, and serves to polish a semiconductor wafer to a flat mirror finish. When interconnections are to be formed as layers on the surface of a semiconductor wafer, the surface of the semiconductor wafer is polished to a flat mirror finish before the layers are deposited, so that the layers will subsequently be formed smoothly on the semiconductor wafer.

Figure 7:
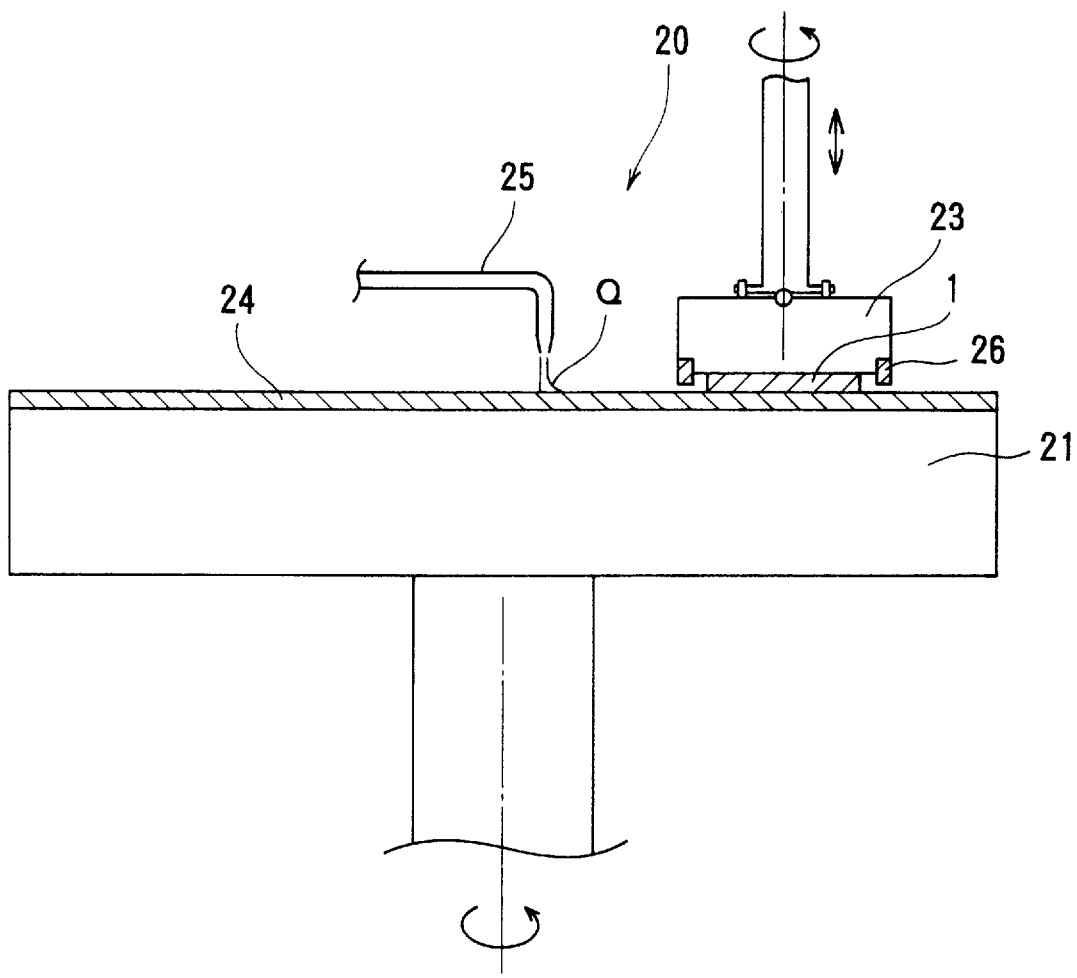
FIG. 7 is a vertical cross-sectional view of the polishing apparatus shown in FIG. 6.

FIG. 7 shows the polishing apparatus 20 in detail. As shown in FIG. 7, the polishing apparatus 20 comprises a turntable 21 and a top ring 23 for holding and pressing a semiconductor wafer 1 against the turntable 21. The turntable 21 is coupled to a motor (not shown) and can be rotated about its own axis in the direction indicated by the arrow. A polishing abrasive cloth 24 is applied to the upper surface of the turntable 21 for contact with the semiconductor wafer 1. The polishing abrasive cloth 24 is made of the same material as that of the cleaning member 3 shown in FIGS. 1 and 2.

The top ring 23 is coupled to a motor (not shown) and also to a cylinder (not shown) for vertically moving the top ring 23. Therefore, the top ring 23 can be vertically moved in the directions indicated by the arrows and also can be rotated about its own axis, so that the semiconductor wafer 1 can be pressed against the polishing abrasive cloth 24 under a desired pressure. An abrasive solution nozzle 25 is positioned over the turntable 21 for supplying an abrasive solution Q onto the polishing abrasive cloth 24 attached to the upper surface of the turntable 21.

In operation, a semiconductor wafer 1 to be polished is conveyed from the wafer storage cassette 30 to the polishing apparatus 20 by the feed robot 35. In the polishing apparatus 20, the semiconductor wafer 1 is supported on the lower surface of the top ring 23, and then pressed against the polishing abrasive cloth 24 on the upper surface of the turntable 21 while it is being rotated. The abrasive solution Q is supplied from the abrasive solution nozzle 25 onto the polishing abrasive cloth 24. The lower surface of the semiconductor wafer 1 is thus polished by the polishing abrasive cloth 24 with the abrasive solution Q existing between the lower surface of the semiconductor wafer 1 and the polishing abrasive cloth 24.

After having been polished, the semiconductor wafer 1 carries on its surface abrasive grains contained in the abrasive solution Q and ground-off particles of the semiconductor wafer 1, and is contaminated by an alkaline metal of potassium (K) because the abrasive solution is of an alkaline base. These abrasive grains, particles and, contaminants have to be cleaned away subsequently.

As shown in FIG. 6, the polished semiconductor wafer 1 is turned upside down to make the polished surface the upper side and conveyed by the feed robot 35 to the first cleaning apparatus 40 in which the semiconductor wafer 1 is scrubbed by a brush to remove most of the abrasive grains, particles, and contaminants from the surface of the semiconductor wafer 1.

After the semiconductor wafer 1 has been cleaned by the cleaning apparatus 40, the semiconductor wafer 1 is fed to the second cleaning apparatus 45 before the surface of the semiconductor wafer 1 is dried. In the second cleaning apparatus 40, the semiconductor wafer 1 is scrubbed by the cleaning member according to the present invention to remove minute particles or submicron particles from the surface of the semiconductor wafer 1 in the manner described above.

The cleaning method according to the present invention has been described above in combination with the polishing step. However, the cleaning method according to the present invention may be any of various steps of the semiconductor fabrication process, e.g., an etching step or a chemical vapor deposition (CVD) step.

The present invention has been shown and described as being embodied for cleaning a semiconductor wafer. However, the principles of the present invention are also applicable to the cleaning of any of other substrates that need to have a high degree of cleanness, e.g., a semiconductor wafer, a glass substrate, a liquid crystal panel, or the like.

The present invention offers the following advantages:

(1) It is possible to remove minute particles or submicron particles from a substrate which cannot be removed by an ordinary scrubbing or chemical cleaning action, for thereby cleaning the substrate highly effectively. Consequently, semiconductor wafers, liquid crystal panels, or the like which have fine patterns can be produced with a high yield.

(2) Particles that are strongly attached to the surface of a substrate can easily be removed by scrubbing.

(3) At the same time a substrate is cleaned, the surface roughness of the substrate can be adjusted to a desired degree for making the substrate surface flat.

(4) A cleaning member that is used to clean a substrate can easily be self-cleaned after it has cleaned the substrate.

Although certain preferred embodiments of the present invention have been shown and described in detail, it should be understood that various changes and modifications may be made therein without departing from the scope of the appended claims.

What is claimed is:

1. A method of cleaning a workpiece, comprising:

at a first cleaning station, performing a preliminary cleaning process to remove particles from a workpiece;

transferring the workpiece from the first cleaning station to a second cleaning station having an abrasive cloth;

holding the workpiece at the second cleaning station; and at the second cleaning station, cleaning the workpiece to remove, from the workpiece, particles remaining on the workpiece after performance of said preliminary cleaning process by scrubbing the workpiece with a cleaning solution and said abrasive cloth of said second cleaning station, wherein said abrasive cloth of said second cleaning station consists essentially of polyurethane and has micropores in a surface contacting said workpiece.

2. A method according to claim 1, wherein said abrasive cloth of said second cleaning station is made of one of polyurethane foam and non-woven fabric composed of fibers bound together by urethane resin.

3. A method according to claim 1, further comprising:

rotating the workpiece during said cleaning of the workpiece at said second cleaning station.

4. A method according to claim 1, wherein said cleaning of the workpiece at said second cleaning station includes at least one time of moving said abrasive cloth of said second cleaning station from a center of the workpiece toward an outer circumferential edge of the workpiece.

5. A method according to claim 1, further comprising:

cleaning said abrasive cloth of said second cleaning station, to remove therefrom the particles resulting from the preliminary cleaning process and which became attached to said abrasive cloth of said second cleaning station during said cleaning of the workpiece at said second cleaning station, by soaking said abrasive cloth of said second cleaning station in a cleaning solution when said abrasive cloth of said second cleaning station is not being used to clean the workpiece.

6. A method according to claim 1, wherein said workpiece comprises a semiconductor wafer.

7. A method according to claim 1, further comprising:

drying said workpiece after said cleaning of the workpiece at said second cleaning station.

8. A method according to claim 7, wherein in said drying of the workpiece, the workpiece is rotated in a dry, inert gas atmosphere.

9. A method to claim 1, wherein said holding of the workpiece at the second cleaning station comprises clamping the workpiece in a chuck.

10. A method according to claim 1, further comprising:

rotating the workpiece at said second cleaning station; and wherein said cleaning solution is supplied to the workpiece at said second cleaning station.

11. A method according to claim 10, wherein said holding and said rotating of the workpiece at the second cleaning station comprise clamping the workpiece in a spinning chuck.

12. A method according to claim 11, wherein said performing of said preliminary cleaning process comprises scrubbing the workpiece with a brush.

13. A method of cleaning a workpiece, comprising:

at a first cleaning station, performing a preliminary cleaning process to remove particles from a workpiece;

transferring the workpiece from the first cleaning station to a second cleaning station having an abrasive cloth;

holding the workpiece at the second cleaning station; and at the second cleaning station, cleaning the workpiece to remove, from the workpiece, particles remaining on the workpiece after performance of said preliminary cleaning process by scrubbing the workpiece with a cleaning solution and said abrasive cloth of said second cleaning station, wherein said abrasive cloth of said second cleaning station is made of synthetic resin and has micropores in a surface contacting said workpiece, said synthetic resin having a hardness selected from a Shore D hardness ranging from 52 to 62, an Asker-C hardness of 80, a Shore A hardness ranging from 58 to 68 and a Shore C hardness ranging from 61 to 71.

14. A method according to claim 13, wherein said abrasive cloth of said second cleaning station is made of one of polyurethane foam and non-woven fabric composed of fibers bound together by urethane resin.

15. A method according to claim 13, further comprising:

rotating the workpiece during said cleaning of the workpiece at said second cleaning station.

16. A method according to claim 13, wherein said cleaning of the workpiece at said second cleaning station includes at least one time of moving said abrasive cloth of said second cleaning station from a center of the workpiece toward an outer circumferential edge of the workpiece.

17. A method according to claim 13, further comprising:

cleaning said abrasive cloth of said second cleaning station, to remove therefrom the particles resulting from the preliminary cleaning process and which became attached to said abrasive cloth of said second cleaning station during said cleaning of the workpiece at said second cleaning station, by soaking said abrasive cloth of said second cleaning station in a cleaning solution when said abrasive cloth of said second cleaning station is not being used to clean the workpiece.

18. A method according to claim 13, wherein said workpiece comprises a semiconductor wafer.

19. A method according to claim 13, further comprising:

drying said workpiece after said cleaning of the workpiece at said second cleaning station.

20. A method according to claim 19, wherein in said drying of the workpiece, the workpiece is rotated in a dry, inert gas atmosphere.

21. A method according to claim 13, wherein said holding of the workpiece at the second cleaning station comprises the workpiece in a chuck.

22. A method to claim 13, further comprising:

rotating the workpiece at said second cleaning station; and wherein said cleaning solution is supplied to the workpiece at said second cleaning station.

23. A method according to claim 22, wherein said holding and said rotating of the workpiece at the second cleaning station comprise clamping the workpiece in a spinning chuck.

24. A method according to claim 13, wherein said performing of said preliminary cleaning process comprises scrubbing the workpiece with a brush.

25. A method of cleaning a workpiece, comprising:

at a first cleaning station, performing a preliminary cleaning process to remove particles from a workpiece;

transferring the workpiece from the first cleaning station to a second cleaning station having an abrasive cloth;

holding the workpiece at the second cleaning station; and at the second cleaning station, cleaning the workpiece to remove, from the workpiece, particles remaining on the workpiece after performance of said preliminary cleaning process by scrubbing the workpiece with a cleaning solution and said abrasive cloth of said second cleaning station, wherein said abrasive cloth of said cleaning station is made of one of polyurethane foam and non-woven fabric composed of fibers bound together by urethane resin.

26. A method according to claim 25, further comprising:

rotating the workpiece during said cleaning of the workpiece at said second cleaning station.

27. A method according to claim 25, wherein said cleaning of the workpiece at said second cleaning station includes at least one time of moving said abrasive cloth of said second cleaning station from a center of the workpiece toward an outer circumferential edge of the workpiece.

28. A method according to claim 25, further comprising:

cleaning said abrasive cloth of said second cleaning station, to remove therefrom the particles resulting from the preliminary cleaning process and which became attached to said abrasive cloth of said second cleaning station during said cleaning of the workpiece at said second cleaning station, by soaking said abrasive cloth of said second cleaning station in a cleaning solution when said abrasive cloth of said second cleaning station is not being used to clean the workpiece.

29. A method according to claim 25, wherein said workpiece comprises a semiconductor wafer.

30. A method according to claim 25, further comprising:

drying said workpiece after said cleaning of the workpiece at said second cleaning station.

31. A method according to claim 30, wherein in said drying of the workpiece, the workpiece is rotated in a dry, inert gas atmosphere.

32. A method according to claim 25, wherein said holding of the workpiece at the second cleaning station comprises clamping the workpiece in a chuck.

33. A method according to claim 25, further comprising:

rotating the workpiece at said second cleaning station; and wherein said cleaning solution is supplied to the workpiece at said second cleaning station.

34. A method according to claim 33, wherein said holding and said rotating of the workpiece at the second cleaning station comprise clamping the workpiece in a spinning chuck.

35. A method according to claim 25, wherein
said performing of said preliminary cleaning process comprises scrubbing the workpiece with a brush.

36. A method of cleaning a workpiece, comprising:
at a first cleaning station, performing a preliminary cleaning process to remove particles from a workpiece;
transferring the workpiece from said first cleaning station to a second cleaning station having an abrasive cloth;
holding the workpiece at said second cleaning station; and
at said second cleaning station, cleaning the workpiece to remove, from the workpiece, particles remaining on the workpiece after performance of said preliminary cleaning process by scrubbing the workpiece with a cleaning solution and said abrasive cloth of said second cleaning station;
wherein said abrasive cloth is smaller than the workpiece and is moved relative to the workpiece.

37. A method according to claim 36, wherein
said abrasive cloth consists essentially of polyurethane and has micropores in a surface contacting said workpiece.

38. A method according to claim 36, wherein
said abrasive cloth is made of synthetic resin and has micropores in a surface contacting said workpiece, said synthetic resin having a hardness selected from a Shore D hardness ranging from 52 to 62, an Asker-C hardness of 80, a Shore A hardness ranging from 58 to 68 and a Shore C hardness ranging from 61 to 71.

39. A method according to claim 36, wherein
said abrasive cloth is made of one of polyurethane foam and non-woven fabric composed of fibers bound together by urethane resin.

* * * * *